(12) United States Patent
Zhu et al.

(10) Patent No.: US 10,762,326 B2
(45) Date of Patent: Sep. 1, 2020

(54) FINGERPRINT IDENTIFICATION DEVICE AND MANUFACTURING METHOD THEREOF, AND ELECTRONIC DEVICE

(71) Applicant: BOE TECHNOLOGY GROUP CO., LTD., Beijing (CN)

(72) Inventors: Wenxiu Zhu, Beijing (CN); Yanliu Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 111 days.

(21) Appl. No.: 16/132,813

(22) Filed: Sep. 17, 2018

(65) Prior Publication Data

US 2019/0220649 A1    Jul. 18, 2019

(30) Foreign Application Priority Data

Jan. 12, 2018    (CN) .......................... 2018 1 0032052

(51) Int. Cl.
| | | |
|---|---|---|
| *G06K 9/00* | (2006.01) | |
| *G06F 3/041* | (2006.01) | |
| *H01L 27/32* | (2006.01) | |

(52) U.S. Cl.
CPC ....... *G06K 9/00087* (2013.01); *G06F 3/0416* (2013.01); *H01L 27/323* (2013.01); *H01L 27/3234* (2013.01); *H01L 27/3246* (2013.01); *H01L 27/3272* (2013.01); *G06F 2203/04103* (2013.01)

(58) Field of Classification Search
CPC .......... G02F 1/13338; G02F 1/133512; G06F 2203/04109; G06F 3/0421; G06F 2203/04106; G06F 3/0412; G06F 3/044; G06F 3/0488; G06K 9/00013; G06K 9/0004; G06K 9/0008; G06K 2009/0006; G06K 9/0002; G06K 9/00053; G02B 5/003; H01L 27/288; H01L 27/3227; H01L 51/5246; H01L 27/323; H01L 27/3234; G09G 3/3233
See application file for complete search history.

(56) References Cited

U.S. PATENT DOCUMENTS

| | | | |
|---|---|---|---|
| 2015/0030217 A1* | 1/2015 | Wickboldt | G06K 9/00026 382/124 |
| 2015/0060125 A1* | 3/2015 | Stevenson | G06F 3/044 174/261 |
| 2017/0091506 A1* | 3/2017 | Sinha | G06F 1/1643 |
| 2017/0323140 A1* | 11/2017 | Huang | G06K 9/0008 |

\* cited by examiner

*Primary Examiner* — Kim Y Vu
*Assistant Examiner* — Michael J Vanchy, Jr.

(57) ABSTRACT

A fingerprint identification device and manufacturing method thereof, and electronic device are disclosed. The fingerprint identification device includes a base film, a detection circuit, and an adhesive layer. The detection circuit is provided at a first side of the base film; the adhesive layer is provided on the first side of the base film, and is provided between the base film and the detection circuit, so as to adhere the detection circuit onto the base film.

18 Claims, 4 Drawing Sheets

FINGERPRINT IDENTIFICATION DEVICE
AND MANUFACTURING METHOD
THEREOF, AND ELECTRONIC DEVICE

CROSS-REFERENCE TO RELATED APPLICATIONS

The application claims priority to Chinese patent application No. 201810032052.5, filed on Jan. 12, 2018, the entire disclosure of which is incorporated herein by reference as part of the present application.

TECHNICAL FIELD

Embodiments of the present disclosure relate to a fingerprint identification device and a manufacturing method thereof, and an electronic device.

BACKGROUND

With continuous developments of electronic science and technology, fingerprint identification technologies are widely applied in mobile phones, personal digital assistants, computers and other electronic devices. Organic light-emitting display panels have gradually become mainstream in the display field, and widely applied in smart phones, tablets, TVs and other electronic products with display capability. Under screen type fingerprint identification is realized through combining fingerprint identification capability and display capability (for example, display capability of the organic light-emitting display panel) and is one of the research topics in the display field.

SUMMARY

At least one embodiment of the present disclosure provides a fingerprint identification device, and the fingerprint identification device includes a base film, a detection circuit, and au adhesive layer. The detection circuit is provided at a first side of the base film; the adhesive layer is provided on the first side of the base film, and is provided between the base film and the detection circuit, so as to adhere the detection circuit onto the base film.

For example, the fingerprint identification device provided by at least one embodiment further includes a refractive index matching film, which is provided on the first side of the base film and provided between the base film and the adhesive layer, in which the refractive index matching film has a first refractive index; the adhesive layer has a second refractive index; and the first refractive index is larger than the second refractive index.

For example, in the fingerprint identification device provided by at least one embodiment, a material of the refractive index matching film includes at least one of an indium tin oxide, a silicon nitride, a silicon carbide or a titanium dioxide.

For example, in the fingerprint identification device provided by at least one embodiment, the refractive index matching film is made of the silicon nitride.

For example, in the fingerprint identification device provided by at least one embodiment, the base film, the refractive index matching film and the adhesive layer are provided to increase a ratio between an intensity of light incident onto the detection circuit and an intensity of light exited from the first side of the base film.

For example, in the fingerprint identification device provided by at least one embodiment, the base film has a third refractive index and the third refractive index is smaller than the first refractive index and is larger than the second refractive index.

For example, in the fingerprint identification device provided by at least one embodiment, a thickness of the refractive index matching film is larger than ¼ of a blue light wavelength and is smaller than a red light wavelength.

For example, in the fingerprint identification device provided by at least one embodiment, the thickness of the refractive index matching film is in a range of 145 nm-650 nm.

For example, in the fingerprint identification device provided by at least one embodiment, an orthographic projection of the detection circuit on the base film is completely within an orthographic projection of the adhesive layer on the base film.

For example, in the fingerprint identification device provided by at least one embodiment, the adhesive layer includes a pressure-sensitive adhesive or an optical transparent adhesive.

For example, the fingerprint identification device provided by at least one embodiment further includes an adhesive tape, in which the adhesive tape is provided at at least one side of the detection circuit in a direction parallel to the base film and is attached onto a surface, which is away from the base film, of the adhesive layer.

For example, the fingerprint identification device provided by at least one embodiment further includes a display array layer provided at a second side of the base film, in which the second side of the base film is opposite to the first side of the base film, the display array layer includes a plurality of sub-pixels, which are arrayed, and at least one opening provided between adjacent sub-pixels, and an orthographic projection of the opening on the detection circuit and the detection circuit at least partially overlap with each other.

For example, in the fingerprint identification device provided by at least one embodiment, the display array layer is an organic light emitting diode display array layer, each of the sub-pixels includes an organic light emitting element and the opening is provided between the organic light emitting elements of the adjacent sub-pixels.

For example, in the fingerprint identification device provided by at least one embodiment, the display array layer further includes a light shield layer, and the light shield layer includes at least one pinhole; an orthographic projection of the pinhole on the detection circuit and the orthographic projection of the opening on the detection circuit at least partially overlap with each other, so as to allow light passing through the pinhole to be able to pass through the opening, such that the light is able to incident on the detection circuit and to be used for fingerprint identification.

For example, in the fingerprint identification device provided by at least one embodiment, the display array layer includes a base substrate; a side, which is closer to the base film, of the base substrate is attached to the base film; and the plurality of sub-pixel is provided at a side, which is away from the base film, of the base substrate.

For example, in the fingerprint identification device provided by at least one embodiment, the base film includes a flexible membrane and the base substrate includes a flexible substrate.

For example, the fingerprint identification device provided by at least one embodiment further includes a touch control structure, in which the touch control structure is provided at a side, which is away from the base film, of the display array layer.

At least one embodiment of the present disclosure further provides an electronic device including the fingerprint identification device provided by any one of the embodiments of present disclosure.

At least one embodiment of the present disclosure further provides a manufacturing method for a fingerprint identification device, which includes: providing a base film; forming an adhesive layer on a first side of the base film; and providing a detection circuit at a side, which is away from the base film, of the adhesive layer, so as to allow the adhesive layer to adhere the detection circuit onto the first side of the base film.

For example, in the method provided by at least one embodiment, before forming the adhesive layer on the first side of the base film, the method further includes: forming a refractive index matching film on the first side of the base film, in which the adhesive layer is formed on a side, which is away from the base film, of the refractive index matching film, so as to form the adhesive layer on the first side of the base film.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not imitative of the disclosure.

DETAILED DESCRIPTION

Figure 1:
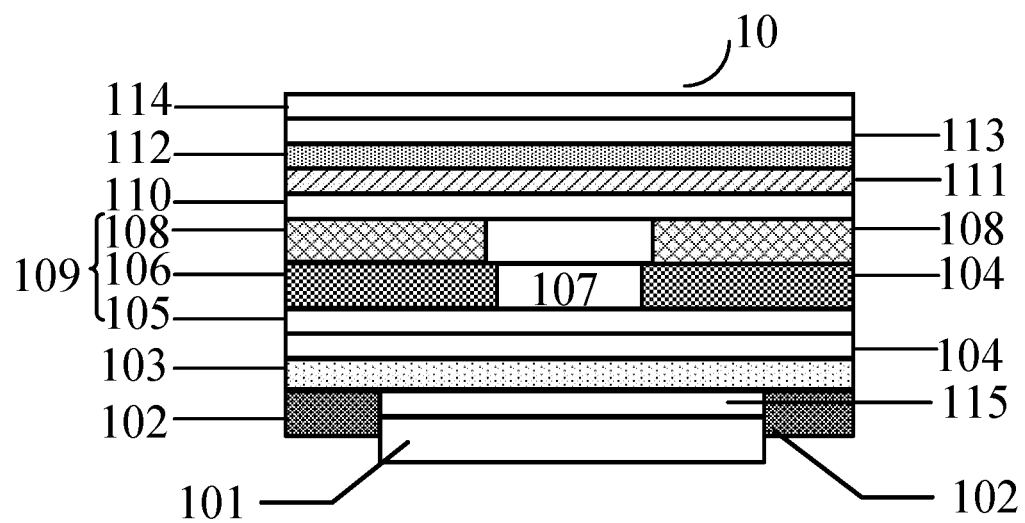
FIG. 1 is a schematically structural cross-sectional view of a fingerprint identification device.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass through the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under." "right," "left" and the like are only used to indicate relative position relationship, and when the position of the object which is described is changed, the relative position relationship may be changed accordingly.

Organic light-emitting diode display panels are widely applied in the display field because of advantages such as self-luminescence, fast response, wide view angle and flexibility. For example, flexible organic light-emitting diode display panels can be applied in various flexible products. Fingerprint recognition devices have been widely applied in portable electronic devices such as mobile phones and tablet computers. At present, a fingerprint identification device is provided outside of a display screen (that is, outside screen type fingerprint identification), and this causes that the bezel of an electronic device such as mobile phone is wide. A display panel with narrow bezel can be realized through integrating fingerprint recognition capability into the display screen (that is, through adopting under screen type fingerprint identification). In addition, integration of display capability and touch control capability is also the development trend of current electronic devices. For example, a fingerprint identification device including a fingerprint detection circuit and an organic light emitting diode display panel with touch control capability can be manufactured, in which the detection circuit for fingerprint identification can be provided below the organic light emitting diode display panel.

FIG. 1 illustrates a fingerprint identification device 10, and the fingerprint identification device 10 can be implemented as a display device with under screen fingerprint identification capability. As illustrated in FIG. 1, the fingerprint identification device 10, for example, can include a fingerprint identification portion, a display array layer portion, a touch control portion, and so on. As illustrated in FIG. 1, the fingerprint identification portion, for example, includes a detection circuit 101, an adhesive tape 102, an air layer 115, a base film 103, a glue layer 104 and so on. The display array layer portion 109, for example, includes a base substrate 105, an array layer 106, an opening 107, an organic light emitting element 108, a polarizer 112 for circularly polarized light, a first adhesive glue 110 and so on. The touch control structure portion, for example, includes a touch control structure 111, a second adhesive glue 113, a protective cover plate 114 and so on. In order to realize fingerprint identification, light reflected by the fingerprint of a finger at a display side of the fingerprint identification device 10 passes through the opening 107 and is incident onto the detection circuit 101, which is configured for realizing the fingerprint identification, and then corresponding detection signals outputted by the detection circuit 101 are sent to a control circuit (for example, a processor and the like) for further signal processing.

For the fingerprint identification device 10 as illustrated in FIG. 1, in order to fix the detection circuit 101, which is configured for realizing the fingerprint identification, under the display array layer portion 109, for example, glue or adhesive (for example, the adhesive tape 102), which is made of viscous glue and applied in a frame-like shape between the detection circuit 101 and the base film 103, can be adopted to adhere the detection circuit 101 onto the base film 103. Because the orthographic projection of the glue in frame-like shape on the detection circuit 101 is applied along the periphery region of the detection circuit 101 while the middle region of the detection circuit 101 is uncovered by the orthographic projection of the glue in frame-like shape, the air layer 115 is formed between the base film 103 and the detection circuit 101. The material of the base film 103, for example, can comprise a resin material and the refractive index of the base film 103 is around 1.65. Because the refractive index of the air layer 115 is 1; by comparison, the base film 103 is an optically denser medium and the air layer 115 is an optically thinner medium. In the process that the light reflected by the fingerprint of the finger sequentially passes through the base film 103 and the air layer 115 and is incident on the detection circuit 101, part of the light which has a large incident angle (i.e., stray light), for example, can be filtered out because total reflection occurs at the interface between the base film 103 and the air layer 115, and the critical angle of total reflection at the interface between the base film 103 and the air layer 115 is about 37 degrees.

However, for the case that the detection circuit 101 is adhered to the base film 103 via the glue in frame-like shape, because the contact area between the frame glue and the detection circuit 101 is relatively small, the glue is possible to be subjected to fractures, for example, when the base film 103, which is flexible, is bent. This can cause displacement and detachment of the detection circuit 101, and thus adversely affects the fingerprint identification effect of the fingerprint identification device 10, or causes failure of the fingerprint identification function.

For another aspect, as illustrated in FIG. 1, the adhesive tape 102 is adhered to the first side of the base film 103, and the detection circuit 101 is adhered onto the first side of the base film 103 via the glue, and the air layer 115 is formed between the detection circuit 101 and the base film 103, and therefore, the adhesive tape 102 and the detection circuit 101 are not in same one plane, this deteriorates the fixation effect of the adhesive tape 102 to the detection circuit 101 to a certain degree.

At least one embodiment of the present disclosure provides a fingerprint identification device, and the fingerprint identification device includes a base film, a detection circuit, and an adhesive layer. The detection circuit is provided at a first side of the base film; the adhesive layer is provided on the first side of the base film, and is provided between the base film and the detection circuit, so as to adhere the detection circuit onto the base film.

In the fingerprint identification device provided by at least one embodiment of the present disclosure, the detection circuit is adhered to the base film via the adhesive layer. Because the surface, which is in contact with the detection circuit, of the adhesive layer is adhesive (for example, the entire surface of the adhesive layer in contact with the detection circuit is adhesive), the contact area between the detection circuit and the adhesive layer is increased. Furthermore, the adhesive layer has certain flexibility, that is, is flexible. For the above-mentioned reasons, the adhesive layer is not easily subjected to fractures, for example, in the case that the flexible base film is bent, and therefore the fixation effect by the adhesive layer to the detection circuit is improved and the detection circuit can receive the light reflected by the fingerprint of the fingerprint with better accuracy, and thus the accuracy of the fingerprint identification of the fingerprint identification device is accordingly improved.

For example, in the fingerprint identification device provided by an embodiment of the present disclosure, a refractive index matching film is further provided. The refractive index matching film is provided on the first side of the base film and is provided between the base film and the adhesive layer. The refractive index matching film has a first refractive index, the adhesive layer has a second refractive index, and the first refractive index of the refractive index matching film is larger than the second refractive index of the adhesive layer.

In the fingerprint identification device provided by the above-mentioned embodiments, the refractive index matching film is provided between the base film and the adhesive layer, and the refractive index of the refractive index matching film is larger than the refractive index of the adhesive layer. Thus, in the process that the light reflected by the fingerprint of the finger sequentially passes through the refractive index matching film and the adhesive layer and then is incident on the detection circuit, part of the light which has a large incident angle (i.e., stray light), for example, can be filtered out because total reflection occurs at the interface between the refractive index matching film and the adhesive layer, such that the quality of an fingerprint image obtained by detection circuit is improved.

The embodiments of the present disclosure are described in the following with reference to a plurality of specific examples. In order to allow the following descriptions of the embodiments of the present disclosure to be clear and concise, detailed descriptions regarding to known functions and known components will be omitted. If a component is illustrated in more than one drawing, the component is represented by same or similar numeral in every drawing.

Figure 2:
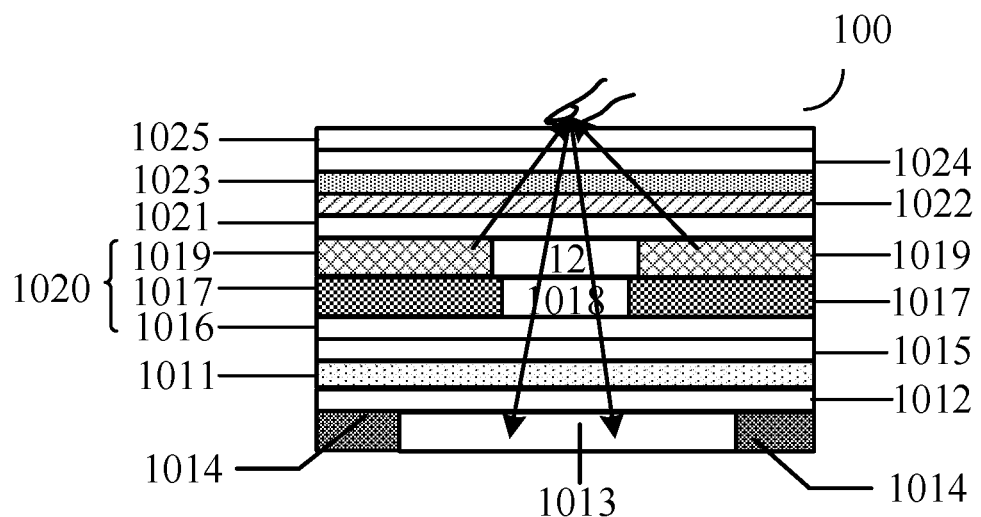
FIG. 2 is a schematically structural cross-sectional view of a fingerprint identification device provided by an embodiment of the present disclosure.

At least one embodiment of the present disclosure provides a fingerprint identification device 100, which can be implemented as a display device. FIG. 2 is a schematically structural cross-sectional view of the fingerprint identification device 100 provided by the embodiment of the present disclosure.

As illustrated in FIG. 2, the fingerprint identification device 100 includes a base film 1011, an adhesive layer 1012 and a detection circuit 1013. The detection circuit 1013 is provided at the first side of the base film 1011 and is configured for realizing optically fingerprint identification. The adhesive layer 1012 is provided on the first side of the base film 1011, and is provided between the base film 1011 and the detection circuit 1013, so as to adhere the detection circuit 1013 onto the base film 1011. In the embodiment of the present disclosure, as illustrated in FIG. 2, the first side of the base film 1011 is a lower side under the base film 1011, and the first side of the base film 1011 in the following embodiments has the same meaning.

As illustrated in FIG. 2, the material of the base film 1011 include an inorganic insulation material such as SiNx, SiOx, glass, or an organic insulation material such as resin material, polyester material, polyimide material, or other suitable material, but the embodiment of the present disclosure is not limited to the above mentioned materials. The base film 1011, for example, can be a bendable flexible membrane. For example, the base film 1011 is a bendable flexible membrane, thus the fingerprint identification device 100 with the flexible base film, for example, can be a bendable flexible display device.

As illustrated in FIG. 2, the adhesive layer 1012 can function as a double-faced adhesive tape, and both sides of the adhesive layer 1012 are, for example, adhesive, such that structures provided on the both sides of the adhesive layer 1012 can be stuck together. For example, as illustrated in FIG. 2, the adhesive layer 1012 is adhered onto the first side of the base film 1011 (the low side in the figures). The detection circuit 1013 is provided at the side, which is away from the base film 1011, of the adhesive layer 1012, such that the adhesive layer 1012 can adhere the detection circuit onto the first side of the base film 1011. Because the entire area in contact with the detection circuit 1013 of the adhesive layer 1012 is adhesive, the contact area between the detection circuit 1013 and the adhesive layer 1012 is accordingly increased, and therefore, the detection circuit 1013 can be adhered onto the adhesive layer 1012 firmly, and the fixation effect to the detection circuit 1013 can be improved. The adhesive layer 1012, for example, can be a pressure-sensitive adhesive or an optical clear adhesive (OCA). Because the pressure-sensitive adhesive and the optical clear adhesive normally have relatively strong adhesion and good peeling-off property, the adhesive layer 1012 can fix the detection circuit 1013 with good effect in both the manufacturing process and using process of the fingerprint identification device. Furthermore, in order to avoid affecting the function of the fingerprint identification adversely, the adhesive layer 1012 can have good light transmittance, but no specific limitations will be given in the embodiments of the present disclosure in this respect. For example, the adhesive layer 1012 is the pressure-sensitive adhesive or the optical transparent adhesive, and the refractive index of the adhesive layer 1012 is, for example, approximately in the range of 1.45-1.50.

For example, the orthographic projection of the detection circuit 1013 on the base film 1011 is completely within the orthographic projection of the adhesive layer 1012 on the base film 1011, that is, the surface, which is closer to the adhesive layer 1012, of the detection circuit 1013 is completely adhered to the adhesive layer 1012, such that the detection circuit 1013 can be adhered onto the adhesive layer 1012 more firmly. For example, the base film 1011 and the adhesive layer 1012 completely overlap with each other in the direction perpendicular to the base film 1011 (i.e., the plane where the base film 1011 is located); in this case, the surface, which is closer to the adhesive layer 1012, of the base film 1011 is completely attached to the adhesive layer 1012, such that the detection circuit 1013 can be adhered onto the base film 1011 more firmly.

The detection circuit 103, for example, can include a photoelectric sensor, a fingerprint identification chip or the like, but no specific limitations will be given in the embodiments of the present disclosure in this respect. The detection circuit 103 can realize imaging function with light in visible wavelength range or light in infrared wavelength range, so as to obtain a fingerprint image. For example, when light, emitted by the organic light emitting element, is incident onto and reflected by the fingerprint, reflected light of the fingerprint is formed, and the reflected light of the fingerprint is, for example, incident onto the photoelectric sensor after passing through the base film 1011, the adhesive layer 1012 and other layer(s). The photoelectric sensor obtains the image information of the fingerprint through analysis and calculation of the reflected light of the fingerprint. The photoelectric sensor sends the image information of the fingerprint obtained through analysis and calculation to a fingerprint identification chip or a central processing unit. The fingerprint identification chip or the central processing unit, for example, can compare the image information of the fingerprint obtained by the photoelectric sensor with a pre-stored fingerprint, so as to realize the fingerprint identification. For example, the fingerprint identification device can prompt the user to retry if the image information of the fingerprint does not match with the pre-stored fingerprint; and the screen of the fingerprint identification device 100 can be unlocked or corresponding operations (for example, payment) can be performed in the case that the image information of the fingerprint matches with the pre-stored fingerprint.

For example, in another example of the embodiment of the present disclosure, the fingerprint identification device, for example, further includes an adhesive tape 1014, a display array layer 1020, a touch control structure 1021 and so on, such that the fingerprint identification device can be further implemented as a touch control display device with touch control function and display function.

As illustrated in FIG. 2, the adhesive tape 1014 is provided on both lateral sides of the detection circuit 1013 in the direction parallel to the base Film 1011, and the adhesive tape 1014 is further adhered to the surface, which is away from the base film 1011, of the adhesive layer 1012, such that the fixation effect to the detection circuit 1013 can be further improved. In the fingerprint identification device 10 as illustrated in FIG. 1, the fixation effect to the detection circuit 101 by the adhesive tape 102 is relatively small, however, in the embodiment of the present disclosure, as illustrated in FIG. 2, both the detection circuit 1013 and the adhesive tape 1014 are adhered onto the adhesive layer 1012, and therefore, no air layer is formed between the detection circuit 1013 and the adhesive layer 1012, and the adhesive tape 1014 and the detection circuit 1013 are located in same one plane, such that the adhesive tape 1014 can fix the detection circuit 1013 with better effect, and displacements, toward the adhesive tape 1014, of the detection circuit 1013 can be avoided.

In the embodiment of the present disclosure, the adhesive tape 1014, for example, can be an adhesive tape with light-shielding function, and therefore, in addition to fixation to the detection circuit 1013, the adhesive tape 1014 also can prevent photo-induced carriers from generating in thin film transistors of the display array layer 1020 when external light is incident onto the thin film transistors, such that undesired leakage current can be avoided. Furthermore, the adhesive tape 1014, for example, can be a soft adhesive tape, and therefore, the adhesive tape 1014, for example, can further have cushion effect to the fingerprint identification device 100 in the case that the fingerprint identification device 100 falls down from a high place and the side, with the adhesive tape 1014 being provided, of the fingerprint identification device 100 is in contact with the ground, and destructions, which is caused by drop and impact, to the fingerprint identification device 100 can be alleviated.

It should be noted that the position relationship between the adhesive tape 1014 and the detection circuit 1013 is not limited to the case described above. For example, in another example of the embodiment of the present disclosure, the adhesive tape 1014 can be provided on only one lateral side of the detection circuit 1013 in the direction parallel to the base film 1011, and is adhered to the surface, which is away from the base film 1011, of the adhesive layer 1012.

As illustrated in FIG. 2, the display array layer 1020 is provided at a second side of the base film 1011 (the upper side illustrated in the figures). For example, the display array layer 1020 can be adhered onto the second side of the base film 1011 via a first glue layer 1015. The first glue layer 1015, for example, can be made of a pressure-sensitive adhesive, an optical transparent adhesive, or any other suitable glue layer, and no specific limitations will be given in the embodiments of the present disclosure in this respect. In the embodiments of the present disclosure, as illustrated in FIG. 2, the second side of the base film 1011 and the first side of the base film 1011 are opposite to each other, that is, as illustrated in FIG. 2, the second side of the base film 1011 is the upper side above the base film 1011, and the second side of the base film 1011 in the following embodiments has same meaning.

The display array layer 1020, for example, call be a liquid crystal display array layer, or can be an organic light emitting diode display array layer, and no specific limitations will be given in the embodiments of the present disclosure in this respect. The embodiment of the present disclosure describes the fingerprint identification device 100 in the following by taking the organic light emitting diode display array layer as the display array layer 1020 for an example.

For example, as illustrated in FIG. 2, the display array layer 1020 includes a base substrate 1016, an array layer 1017, all organic light emitting element 1019, a pixel definition layer 12 and so on.

As illustrated in FIG. 2, the base substrate 1016, for example, is adhered onto the second side of the base film 1011 via the first glue layer 1015. The base substrate 1016, for example, can be a glass substrate, a quartz substrate, a plastic substrate or other substrate made of a suitable material. For example, the base substrate 1016 is a transparent substrate, so as to allow the light reflected by the fingerprint to be able to pass through the base substrate 1016 and incident onto the detection circuit 1013. In an example, the base substrate 1016 call be a flexible base substrate. For example, in the case that the base substrate 1016 is the flexible base substrate, the fingerprint identification device 100 including the flexible base substrate 1016 can be, for example, a bendable and flexible screen, such that the fingerprint identification device 100 is bendable and flexible. In the case that the base substrate 1016 is the flexible base substrate, the base substrate 1016 can be fabricated by, for example, polyimide, polycarbonate, polyethylene, polyethylene terephthalate, polyacrylate and other suitable organic material. For example, in another example of the embodiment of the present disclosure, the base substrate 1016 also can be an opaque structure. In the case that the base substrate is the opaque structure, the base substrate, for example, can include at least one opening, and the orthographic projection of the opening of the base substrate on the detection circuit 1013 and the orthographic projection of the opening 1018 of the array layer 1017 on the detection circuit 1013 at least partially overlap with each other, so as to allow the light reflected by the fingerprint to be able to pass through the opening of the base substrate and the opening 1018 of the array layer 1017 and be incident onto the detection circuit 1013.

As illustrated in FIG. 2, a plurality of sub-pixels, which are arrayed, are provided at the side, which is away from the base film 1011, of the base substrate 1016. For example, each of the sub-pixels includes a thin film transistor, a storage capacitor, the organic light emitting element 1019 and so on, and at least one opening 1018 is provided at a pre-determined position between adjacent sub-pixels of the display array layer. The orthographic projection of the opening 1018 on the detection circuit 1013 and the detection circuit 1013 at least partially overlap with each other, so as to allow the light reflected by the fingerprint to be able to, for example, pass through the opening 1018 and incident onto the detection circuit 1013, and to allow the fingerprint identification to be realized when the light emitted by the organic light emitting element 1019 is reflected by the fingerprint and reflected light by the fingerprint is formed.

It should be noted that, in the embodiments of the present disclosure, the opening 1018 is not necessarily a real through-hole or a pinhole. For example, the opening 1018 can be implemented as a transparent layer provided between adjacent sub-pixels in the array layer 1017; in this case, the light reflected by the fingerprint can also be incident onto the detection circuit 1013 after passing through the transparent layer. The transparent layer can be a transparent conductive layer or a transparent insulation layer. A planarization layer, for example, can be formed onto the array layer 1017 so as to planarize the surface of the array layer 1017. The thin film transistor, for example, can be implemented as a top-gate type thin film transistor or a bottom-gate type thin film transistor. The thin film transistor, for example, can include a gate electrode, a source electrode, a drain electrode, a gate insulation layer, an active layer and so on. The organic light emitting element 1019, for example, can include a pixel electrode, a common electrode, a function layer provided between the common electrode and the pixel electrode, and so on. The function layer, for example, includes an organic light-emitting layer, and can further include one or more of a hole transport layer, a hole injection layer, an electron transport layer or an electron injection layer according to specific implementation demands.

As illustrated in FIG. 2, a pixel definition layer 12 (PDL) can be provided between the organic light emitting elements 1019 of the adjacent sub-pixels. In the embodiments of the present disclosure, the pixel definition layer 12, for example, can be a transparent structure, so as to allow the light reflected by the fingerprint to be able to incident onto the detection circuit 1013 after passing through the pixel definition layer 12 and the opening 1018. Apparently, in the embodiments of the present disclosure, the pixel definition layer 12 is not limited to be implemented as the transparent structure. For example, in another example of the embodiment of the present disclosure, the pixel definition layer 12 also can be an opaque structure. In the case that the pixel definition layer is the opaque structure, the opaque pixel definition layer, for example, can include at least one opening, the orthographic projection of the opening of the pixel definition layer on the detection circuit 1013 and the orthographic projection of the opening 1018 on the detection circuit 1013 at least partially overlap with each other, so as to allow the light reflected by the fingerprint to be able to incident onto the detection circuit 1013 after passing through the opening of the pixel definition layer 12 and the opening 1018. In the embodiments of the present disclosure, the pixel definition layer 12 can be fabricated by one or more organic insulation materials selected from the group consisting of polyimide, polyamide, acrylic resin, benzo cyclo butene and phenolic resin, but no specific limitations will be given in the embodiments of the present disclosure in this respect. A source electrode or a drain electrode of a driving thin film transistor in a pixel circuit, for example, can be connected to the pixel electrode of the organic light emitting element 1019, such that the brightness of the light emitted by the organic light emitting element 1019 of each of the sub-pixels can be controlled.

It should be noted that, in the embodiments of the present disclosure, the number of the opening or openings 1018 are provided between the organic light emitting elements 1019 of adjacent sub-pixels, that is, the embodiment is not limited to the case of one opening 1018, and the number of the openings 1018 between the organic light emitting elements 1019, for example, can be set to be two, three or more. The specific number can be adjusted according to implementation demands, and no specific limitations will be given in the embodiments of the present disclosure in this respect.

For example, in another example of the embodiment of the present disclosure, the fingerprint identification device 100 further includes a touch control structure 1022, a protective cover plate 1025 and so on. The protective cover plate 1025 is used to protect the fingerprint identification device 100 and is configured as a component of the fingerprint identification device 100. As illustrated in FIG. 2, the touch control structure 1022 is provided at the side, which is away from the base film 1011, of the display array layer 1020, and is provided between the protective cover plate 1025 and the display array layer 1020. As illustrated in FIG. 2, for example, the touch control structure 1022 can be adhered onto the side, which is away from the base film 1011, of the display array layer 1020 via a second glue layer 1021. The second glue layer 1021, for example, can be a pressure-sensitive adhesive or an optical transparent adhesive or any other suitable glue layer, and no specific limitations will be given in the embodiments of the present disclosure in this respect.

For example, in another example, the touch control structure 1022 also can be implemented as a component of the display array layer 1020. For example, the touch control structure 1022 can be provided at the side, which is away from the base film 1011, of the display array layer 1020 and at a second side (for example, an upper side as illustrated in FIG. 2) of the organic light emitting element 1019; for another example, the touch control structure 1022 also can be provided between the array layer 1017 and the organic light emitting element 1019, or can be provided between the array layer 1017 and the base substrate 1016, and no specific limitations will be given to the combination way of the touch control structure 1022 and the display array layer 1020.

The touch control structure 1022 can be set according to specific implementation demands, for example, the touch control structure 1022 can be a capacitance type touch control structure, a resistance type touch control structure, a surface acoustic wave type touch control structure, or other suitable touch control structures. For example, in the case that the touch control structure 1022 is the capacitance type touch control structure, the touch control structure 1022 can be a surface capacitance type touch control structure or a projective capacitive type touch control structure. In the case that the touch control structure 1022 is the projective capacitive type, the touch control structure 1022 can be a self-capacitance type touch control structure or a mutual capacitance type touch control structure. The self-capacitance type touch control structure, for example, includes a plurality of self-capacitance electrodes arranged in same one layer and each of the self-capacitance electrodes is electrically connected to a corresponding wire, and the corresponding wire is connected to a touch control processing circuit. The mutual capacitance type touch control structure, for example, includes a plurality of driving electrodes and a plurality of sensing electrodes, and the plurality of driving electrodes and the plurality of sensing electrodes are provided in same one layer or in different layers, and intersected with each other. The touch control processing circuit is electrically to the driving electrodes so as to apply driving signals to the driving electrodes; and the touch control processing circuit is electrically to the sensing electrodes, so as to receive sensed signals outputted by the sensing electrodes.

As illustrated in FIG. 2, the fingerprint identification device 100, for example, can further include a polarizer 1023 for circularly polarized light, a third glue layer 1024 and so on. The polarizer 1023 is provided between the touch control structure 1022 and the protective cover plate 1025. The polarizer 1023 is configured to absorb external light, which is originated from outside of the fingerprint identification device 100 and reflected by the pixel electrode or the common electrode in the organic light emitting element 1019, so as to increase the contrast ratio of displayed images. The third glue layer 1024 is provided between the touch control structure 1022 and the protective cover plate 1025 to stick the protective cover plate 1025 and the touch control structure 1022 together.

It should be noted that, for the sake of clarity, not all structures of the fingerprint identification device 100 are described. To realize the functions of the fingerprint identification device, other structures can be provided, which are not illustrated in the figures according to specific implementation demands, and no specific limitations will be given in the embodiments of the present disclosure in this respect.

In at least one embodiment of the present disclosure provided by the fingerprint identification device 100, the detection circuit 1013 is adhered onto the base film 1011 via the adhesive layer 1012. Because the entire surface of the adhesive layer 1012 is in contact with the detection circuit 1013 and is adhesive, the area in contact with the detection circuit 1013 of the adhesive layer 1012 is increased. Furthermore, the adhesive layer 1012 has certain flexibility. For the above-mentioned reasons, the adhesive layer 1012 is not easily subjected to fractures, for example, in the case that the flexible base film 1011 is bent, and therefore, fixation effect to the detection circuit 1013 is improved and the detection circuit 1013 can obtain the image information of the fingerprint with better accuracy in the case that the light reflected by the fingerprint of the fingerprint passes through the opening 1018 and is incident onto the detection circuit 1013, such that that the fingerprint identification accuracy of the fingerprint identification device 100 can be increased.

Figure 3:
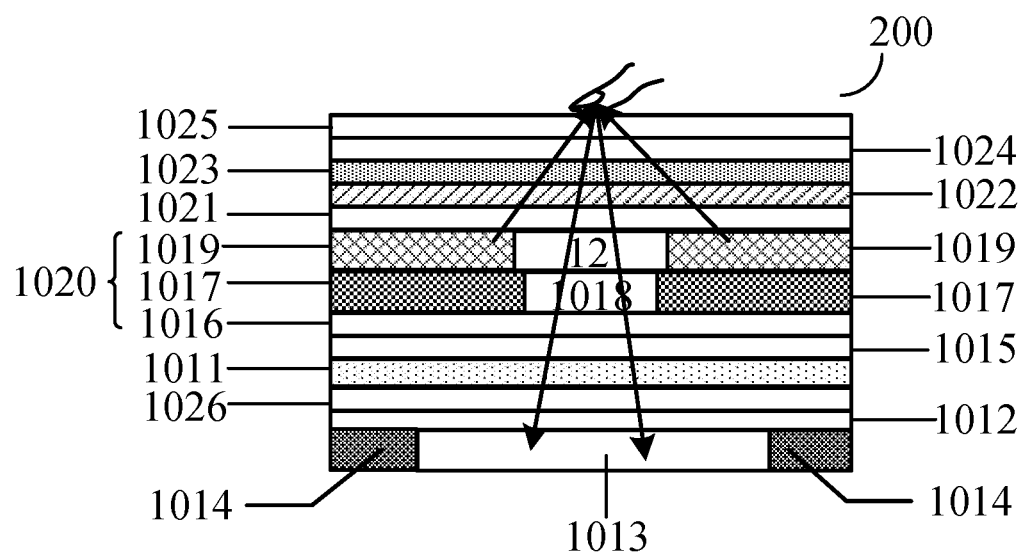
FIG. 3 is a schematically structural cross-sectional view of another fingerprint identification device provided by an embodiment of the present disclosure.

At least one embodiment of the present disclosure provides another fingerprint identification device 200, which also can be implemented as a display device. FIG. 3 is a schematically structural cross-sectional view of the fingerprint identification device 200 provided by the embodiments of the present disclosure. Referring to FIG. 3, the fingerprint identification device 200 further includes a refractive index matching film 1026, and other structures in the fingerprint identification device 200 illustrated in FIG. 3, for example, can be similar to the fingerprint identification device 100 illustrated in FIG. 2.

In the case that light emitted by a light source (for example, the organic light emitting element 1019) is incident onto the fingerprint of the skin of the finger, obtaining the light reflected by the fingerprint, the light reflected by the fingerprint normally passes through a plurality of layers and then is incident onto the detection circuit 1013. When the light reflected by the fingerprint is transmitted through the plurality of layers, undesired stray light can be generated by, for example, interactions between the light and different layers, and can be incident onto the detection circuit 1013, and therefore, the signal-to-noise ratio of the fingerprint image, which is obtained by the detection circuit 1013, is small, and the identification of the fingerprint image may become hard or impossible. Therefore, the fingerprint identification accuracy of the fingerprint identification device is decreased.

In the embodiments of the present disclosure, as illustrated in FIG. 3, the refractive index matching film 1026 is provided on the first side of the base film 1011, and is provided between the base film 1011 and the adhesive layer 1012. The refractive index matching film 1026 has a first refractive index n1, the adhesive layer 1012 has a second refractive index n2, and the first refractive index n1 of the refractive index matching film 1026 is larger than the second refractive index n2 of the adhesive layer 1012. Therefore, by comparison, the refractive index matching film 1026 is an optically denser medium, and the adhesive layer 1012 is an optically thinner medium.

In the case that the light reflected by the fingerprint of the fingerprint sequentially passes through the refractive index matching film 1026 and the adhesive layer 1012 and then is incident onto the detection circuit 1013, because the first refractive index n1 of the refractive index matching film 1026 is larger than the second refractive index n2 of the adhesive layer 1012, part of the light (i.e., at least part of the stray light) reflected by the fingerprint can be filtered out because of the light total reflection at the interface between the refractive index matching film 1026 and the adhesive layer 1012, and noise in the fingerprint images obtained by the detection circuit 1013 is decreased, the quality of the fingerprint images obtained by the detection circuit 1013 is increased, and thus the signal-to-noise ratio of the fingerprint images obtained by the detection circuit 1013 is increased.

In the embodiments of the present disclosure, the refractive index matching film 1026 can be fabricated by one or more materials selected from indium tin oxide (n1=2.0), silicon nitride (n1=2.3), silicon carbide (n1=2.6), titanium dioxide (n1=2.7), and other suitable material. The material of the adhesive layer 1012, for example, can be a pressure-sensitive adhesive (n2≈1.45-1.50) or an optical transparent adhesive (n2≈1.45-1.50) or any other suitable material. According to the following equation for calculating the critical angle of total reflection θ=arcsin(n2/n1), the critical angle of total reflection at the interface between the refractive index matching film 1026 and the adhesive layer 1012 can be changed in the case that the refractive index of the refractive index matching film 1026 is changed. For example, in the case that the refractive index matching film 1026 is a thin film made of indium tin oxide, and the adhesive layer 1012 is an optical transparent adhesive with the refractive index of 1.45, the critical angle θ of total reflection at the interface of the refractive index matching film 1026 and the adhesive layer 1012 is about 46 degrees; in the case that the refractive index matching film 1026 is a thin film made of silicon nitride, and the adhesive layer 1012 is an optical transparent adhesive with the refractive index of 1.45, the critical angle θ of total reflection at the interface of the refractive index matching film 1026 and the adhesive layer 1012 is about 39 degrees; in the case that the refractive index matching film 1026 is a thin film made of silicon carbide, and the adhesive layer 1012 is an optical transparent adhesive with the refractive index of 1.45, the critical angle θ of total reflection at the interface of the refractive index matching film 1026 and the adhesive layer 1012 is about 34 degrees; in the case that the refractive index matching film 1026 is a thin film made of titanium dioxide, and the adhesive layer 1012 is an optical transparent adhesive with the refractive index of 1.45, the critical angle θ of total reflection at the interface of the refractive index matching film 1026 and the adhesive layer 1012 is about 32 degrees.

Furthermore, as described above, in the fingerprint identification device 10 as illustrated FIG. 1, the critical angle of total reflection at the interface between the base film 103 and the air layer 115 is about 37 degrees, and the overall transmittance of the three-layer structure formed by the base film 103, the air layer 115 and the detection circuit 101 is about 90%. However, in the fingerprint identification device 200 provided by an embodiment of the present disclosure, in the case that the structure with the critical angle of total reflection that is close to the critical angle of total reflection as illustrated in FIG. 1 (for example, the refractive index matching film 1026 is a thin film made of silicon nitride, and the adhesive layer 1012 is an optical transparent adhesive with the refractive index of 1.45, and the critical angle θ of total reflection at the interface of the refractive index matching film 1026 and the adhesive layer 1012 is about 39 degrees), the overall transmittance of a four-layer structure formed by the base film 1011, the refractive index matching film 1026, the adhesive layer 1012 and the detection circuit 1013 is about 93%, and therefore, the optically transmittance of the fingerprint identification device 200 is increased.

For example, the thickness of the refractive index matching film 1026 is larger than ¼ of a blue light wavelength (for example, 450 nm) and is smaller than a red light wavelength (for example, 650 nm), and the thickness of the refractive index matching film 1026 can be, for example, equal to a green light wavelength (that is, the wavelength of the green light emitted by a green sub-pixel of the display array layer, for example, 525 nm). The thickness of the refractive index matching film 1026 is, for example, can be in the range of 145 nm-650 nm (for example, is equal to 200 nm, 345 nm or 550 nm). The refractive index of the base film 1011 has a third refractive index, and the third refractive index is, for example, smaller than the first refractive index and larger than the second refractive index. For example, in the case that the refractive index of the base film 1011 and the refractive index of the adhesive layer 1012 remains unchanged, destructive interference between the light, which is originated from the finger and reflected by the surface of the refractive index matching film closer to the detection circuit, and the light, which is originated from the finger and reflected by the surface of the refractive index matching film away from the detection circuit, can be occurred through adjusting the thickness of the refractive index matching film 1026, the first refractive index, the second refractive index and the third refractive index. Therefore, the intensity of light incident onto the detection circuit 1013 is increased, and the ratio between the intensity of light incident onto the detection circuit 1013 and the intensity of light exited from the first side of the base film 1011 is increased, such that the signal-to-noise ratio of the fingerprint images obtained by the detection circuit 1013 can be further increased. For example, the surface, which is closer to the detection circuit, of the refractive index matching film 1026 and the surface, which is away from the detection circuit of the refractive index matching film 1026 can both parallel to the base film 1011, that is, the thickness of the refractive index matching film 1026 can be uniform.

In at least one embodiment of the present disclosure provided by the fingerprint identification device 200, in one aspect, the detection circuit 1013 is adhered onto the base film 1011 via the adhesive layer 1012. Because the entire surface of the adhesive layer 1012 is in contact with the detection circuit 1013 and is adhesive, the contact area between the detection circuit 1013 and the adhesive layer 1012 is increased, the fixation effect to the detection circuit 1013 is improved. In another aspect, the refractive index matching film 1026 is provided between the base film 1011 and the adhesive layer 1012; in the case that the light reflected by the fingerprint of the fingerprint sequentially passes through the refractive index matching film 1026 and the adhesive layer 1012 and then is incident onto the detection circuit 1013, because the first refractive index n1 of the refractive index matching film 1026 is larger than the second refractive index, n2 of the adhesive layer 1012, part of the light (i.e., at least part of the stray light) reflected by the fingerprint can be filtered out because of the light total reflection occurring at the interface between the refractive index matching film 1026 and the adhesive layer 1012, and therefore, the quality of the fingerprint images obtained by the detection circuit 1013 is increased, and the fingerprint identification accuracy of the fingerprint identification device 200 is increased.

In at least one embodiment, in the case that the refractive index matching film 1026 is a thin film made of silicon nitride and the adhesive layer 1012 is an optical transparent adhesive, the refractive index matching film 1026 and the adhesive layer 1012 can further increase the optically transmittance of the fingerprint identification device 200 compared with a conventional fingerprint identification device, such that light efficiency is increased and power consumption of the fingerprint identification device 200 is decreased.

Figure 4A:
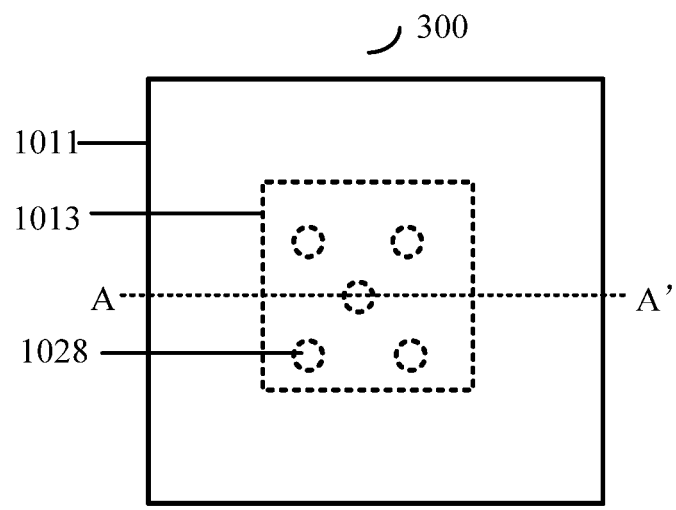
FIG. 4A is a plan view of further another fingerprint identification device provided by an embodiment of the present disclosure.
Figure 4B:
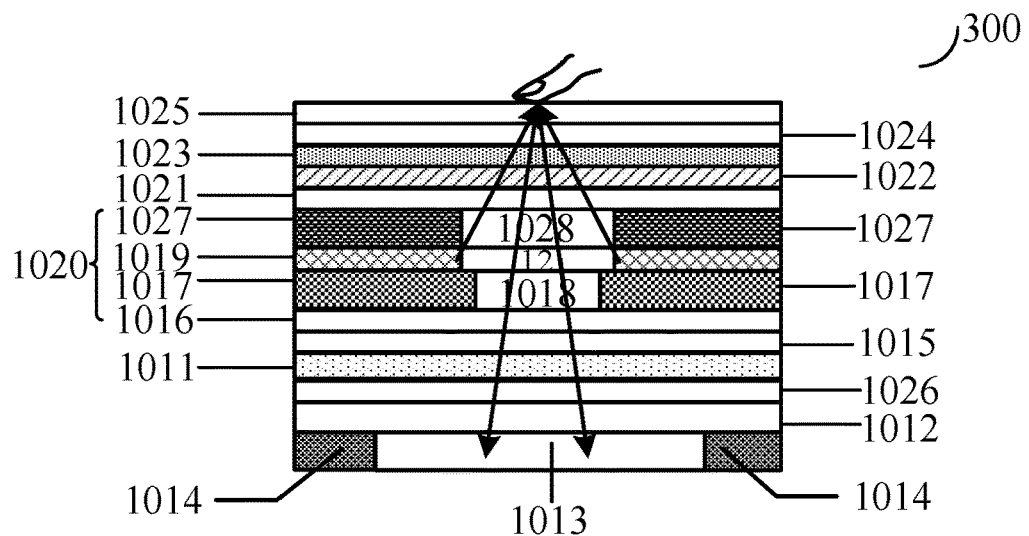
FIG. 4B is a schematically structural cross-sectional view, which is obtained along line A-A', of the fingerprint identification device as illustrated in FIG. 4A.

At least one embodiment of the present disclosure provides further another fingerprint identification device 300, which also can be implemented as a display device. FIG. 4A is a plan view of part of the fingerprint identification device 300 provided by the embodiment of the present disclosure, and FIG. 4B is a schematically structural cross-sectional view, which is obtained along line A-A', of the fingerprint identification device 300 as illustrated in FIG. 4A. As illustrated in FIG. 4A and FIG. 4B, the fingerprint identification device further includes a light shield layer 1027 with pinholes 1028, such that images obtained by the fingerprint identification device 300 and based on pinhole imaging effect can be improved. For example, other structures, except for the light shield layer 1027, in the fingerprint identification device 300 illustrated in FIG. 4A and FIG. 4B can be same as or similar to the fingerprint identification device 100 illustrated in FIG. 2.

As illustrated in FIGS. 4A and 4B, the light shield layer 1027 is provided at the side, which is away from the base film 1011, of the organic light emitting element 1019, and is provided between the organic light emitting element 1019 and the second glue layer 1021. The light shield layer 1027 includes at least one pinhole 1028, and the orthographic projection of the pinhole 1028 on the detection circuit 1013 and the orthographic projection of the opening 1018 of the display array layer 1020 on the detection circuit 1013 at least partially overlap with each other. The light reflected by the fingerprint can pass through the pinhole 1028 and the opening 1018, and then is incident onto the detection circuit 1013, such that the detection circuit 1013 can obtain the image information of the fingerprint according to pinhole imaging effect and the fingerprint identification can be realized. In the embodiments of the present disclosure, the light shield layer 1027 can be fabricated by an opaque material selected from metals, inorganic materials, organic materials, and the like, but no specific limitations will be given in the embodiments of the present disclosure in this respect. For example, in the fingerprint identification device 300 as illustrated in FIGS. 4A and 4B, the light shield layer 1027 can cover only part of the organic light emitting element 1019, such that the fingerprint identification device 300 can realize display function through the organic light emitting element 1019, which is not covered by the light shield layer 1027; for example, the light shield layer 1027 can cover only the organic light emitting element 1019 located at the periphery of the fingerprint identification device 300.

It should be noted that, in the embodiments of the present disclosure, one or more pinholes 1028 can be formed. The number of the pinholes 1028 of the light shield layer 1027, for example, can be set to be two, three or more. The specific number can be adjusted according to implementation demands, and no specific limitations will be given in the embodiments of the present disclosure in this respect.

Figure 4C:
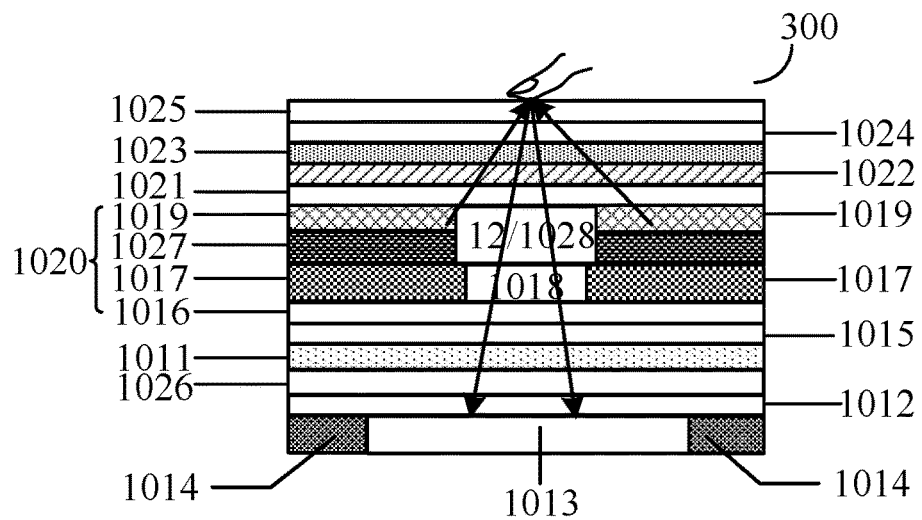
FIG. 4C is a schematically structural cross-sectional view of still another fingerprint identification device provided by an embodiment of the present disclosure.

Apparently, the position of the light shield layer 1027 is not limited to the case as illustrated in FIGS. 4A and 4B. For example, in another example, as illustrated in FIG. 4C, the light shield layer 1027 is provided between the array layer 1017 and the organic light emitting element 1019; the light shield layer 1027 includes at least one the pinhole 1028, and the orthographic projection of the pinhole 1028 on the detection circuit 1013 and the orthographic projection of the opening 1018 of the display array layer 1020 on the detection circuit 1013 at least partially overlap with each other. As illustrated in FIG. 4C, the pixel definition layer (PDL) 12, which is provided between adjacent organic light emitting elements 1019 and provided on the light shield layer 1027, can fill in the pinhole 1028. Alternatively, in another example, the layer, in which the source electrode and the drain electrode of the thin film transistor are provided, can be implemented as the light shield layer 1027; for example, the pinholes 1028 can be provided at positions corresponding to the source electrodes and the drain electrodes of thin film transistors, so as to allow the orthographic projection of the pinhole 1028 on the detection circuit 1013 to at least partially overlap with the orthographic projection of the opening 1018 of the display array layer 1020 on the detection circuit 1013.

In at least one example of the fingerprint identification device 300 provided by the embodiment of the present disclosure, by providing the light shield layer 1027 with at least one the pinhole 1028, the light reflected by the fingerprint can pass through the pinhole 1028 and the opening 1018 and then be incident onto the detection circuit 1013, such that the) detection circuit 1013 can obtain the image information of the fingerprint according to pinhole imaging and the fingerprint identification can be realized and the fingerprint identification accuracy can be accordingly improved.

At least one embodiment of the present disclosure further provides an electronic device, and the electronic device, for example, is a display device with the fingerprint identification capability, or a display device with both the fingerprint identification capability and touch control capability. The electronic device includes the fingerprint identification device provided by any one of the above-mentioned embodiments. The electronic device, for example, can be a tablet, a notebook computer, a camera, a navigator and any product or component including the fingerprint identification device. The technical effect of the electronic device can refer to the technical effect of the fingerprint identification device provided by any one of the above-mentioned embodiments, and no further descriptions will be given here.

At least one embodiment of the present disclosure further provides a method for manufacturing a fingerprint identification device, which includes: providing a base film; forming an adhesive layer on a first side of the base film;

providing a detection circuit at a side, which is away from the base film, of the adhesive layer, so as to allow the adhesive layer to adhere the detection circuit onto the first side of the base film.

The manufacturing method is described in the following by taking the fingerprint identification device 200 as illustrated in FIG. 3 as an example. FIGS. 5A-5D are schematically structural cross-sectional views of a fingerprint identification device, in different manufacturing stages, provided by the embodiments of the present disclosure. The embodiment of the present disclosure is described by taking the case that the fingerprint identification device 200 is implemented as a display device as an example, but the embodiments of the present disclosure are not limited to this case.

Figure 5A:
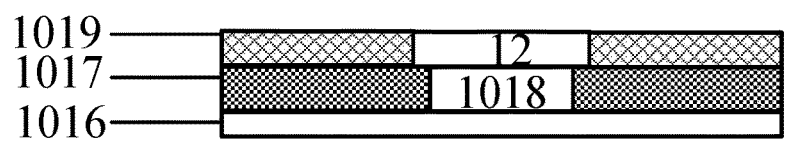
FIGS. 5A-5D are schematically structural cross-sectional views of a fingerprint identification device, in different manufacturing stages, provided by an embodiment of the present disclosure.

As illustrated in FIG. 5A, firstly, a base substrate 1016 is provided, and the base substrate 1016, for example, can be a glass substrate, a quartz substrate, a plastic substrate or other substrates made of suitable material. The base substrate 1016, for example, can be a flexible base substrate. In the case that the base substrate 1016 is the flexible base substrate, the base substrate 1016 can be fabricated by, for example, polyimide, polycarbonate, polyethylene, polyethylene terephthalate, polyacrylate and other suitable organic material.

As illustrated in FIG. 5A, a metal layer, a gate insulation layer, an active layer, a source-drain electrode metal layer can be sequentially formed on the base substrate 1016 through, for example, chemical vapor deposition, physical vapor deposition, and other suitable method. An array layer 1017 with a plurality of sub-pixels in an array can be formed by patterning processes (for example, photolithography process) to corresponding layers. For example, each of the sub-pixels of the array layer 1017 includes a thin film transistor, at least part of a gate line, at least part of a data line, and the so on, and at least one opening 1018 is provided between adjacent sub-pixels so as to allow light to be able to pass through the opening 1018.

After the array layer 1017 is formed on the base substrate 1016, a pixel electrode layer, a function layer, an organic layer, a common electrode layer can be formed on the array layer 1017 through, for example, chemical vapor deposition, physical vapor deposition and other suitable method. Patterning processes (for example, photolithography process) can be performed to corresponding layers when required, such that organic light emitting elements 1019 and a pixel definition layer 12 can be formed on the array layer 1017. Each of the organic light emitting elements 1019, for example, may include a pixel electrode, a common electrode, a function layer provided between the common electrode and the pixel electrode, and the like. The function layer, for example, includes an organic light-emitting layer, and can further include one or more of a hole transport layer, a hole injection layer, an electron transport layer and an electron injection layer according to specific implementation demands. The opening 1018 is formed between adjacent sub-pixels. The pixel definition layer 12 is provided between the organic light emitting elements 1019 of adjacent sub-pixels and the pixel definition layer 12 can be fabricated by one or more organic insulation materials selected from polyimide, polyamide, acrylic resin, benzo cyclo butene and phenolic resin, but no specific limitations will be given in the embodiments of the present disclosure in this respect. The pixel electrode of the organic light emitting element 1019 can be connected to a source electrode or a drain electrode of a driving thin film transistor in a pixel circuit.

Figure 5B:
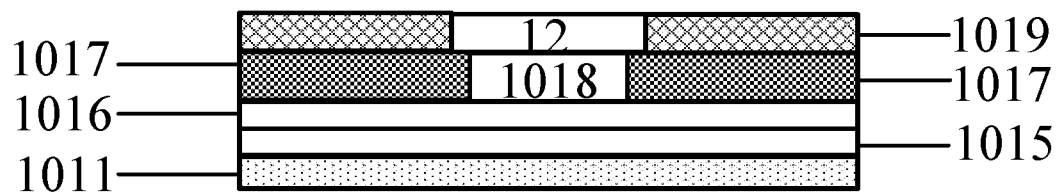

As illustrated in FIG. 5B, because the thickness of the base substrate 1016 is small and the surface, which is away from the array layer 1017, of the base substrate 1016 can be easily polluted by for example dust or feign particles if no protective layer is provided. A first glue layer 1015 can be coated or applied onto the surface, which is away from the array layer 1017, of the base substrate 1016 after the array layer 1017 and the organic light emitting element 1019 are formed on the base substrate 1016. The first glue layer 1015, for example, can be a pressure-sensitive adhesive or an optical transparent adhesive, or any other suitable glue layer, but no specific limitations will be given in the embodiments of the present disclosure in this respect.

As illustrated in FIG. 5B, a base film 1011, for example, can be formed at the side, which is away from the base substrate 1016, of the first glue layer 1015. The material of the base film 1011 include an inorganic insulation material such as SiNx, SiOx, glass, or an organic insulation material such as a resin material, polyester material, polyimide material, or other suitable material, but the embodiments of the present disclosure are not limited to this case. The base film 1011, for example, can be a flexible membrane.

Figure 5C:
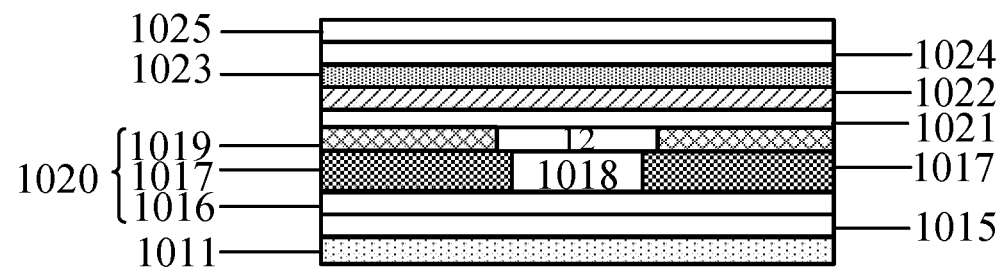

As illustrated in FIG. 5C, after the first glue layer 1015 is coated or applied onto the side, which is away from the array layer 1017, of the base substrate 1016, and after the base film 1011 is formed onto the first glue layer 1015, for example, a second glue layer 1021 can be coated or applied onto the organic light emitting element 1019. The second glue layer 1021, for example, can include a pressure-sensitive adhesive or an optical transparent adhesive or any other suitable adhesive, and no specific limitations will be given in the embodiments of the present disclosure in this respect.

As illustrated in FIG. 5C, a touch control layer can be formed on the second glue layer 1021 through, for example, chemical vapor deposition, physical vapor deposition and other suitable method. Patterning processes (for example, photolithography process) can be performed to the touch control layer so as to form the touch control structure 1022. In another example, the touch control structure 1022, for example, can include a wire layer, a touch control electrode layer and so on, but no specific limitations will be given in the embodiments of the present disclosure in this respect.

As illustrated in FIG. 5C, after the touch control structure 1022 is formed, for example, a circular polarizer 1023, a third glue layer 1024, a protective cover plate 1025 and so on can be sequentially provided onto the touch control structure 1022.

Figure 5D:
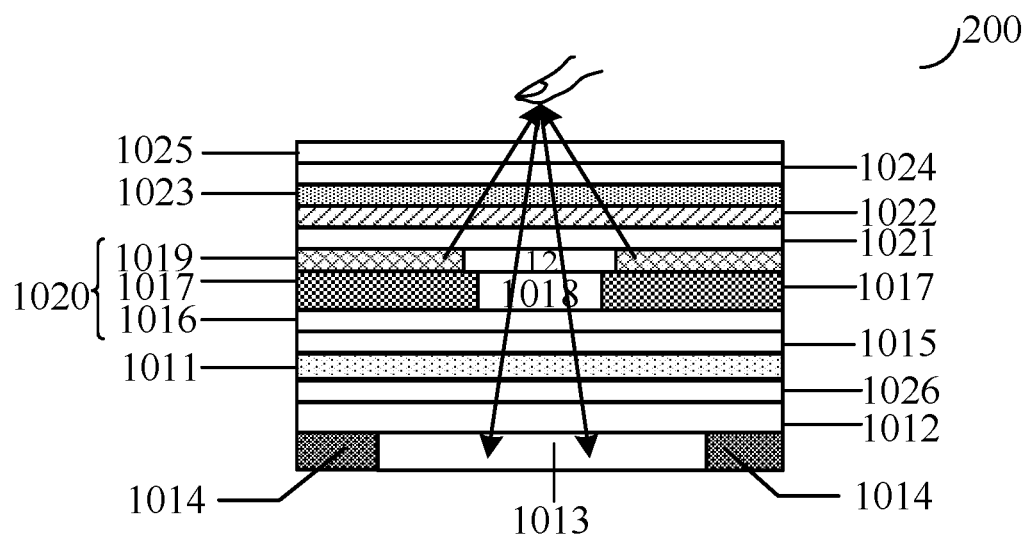

As illustrated in FIG. 5D, after the polarizer 1023 for circularly polarized light, the third glue layer 1024, the protective cover plate 1025 and so on are formed, a refractive index matching film 1026, for example, can be formed at the first side of the base film 1011, through, for example, chemical vapor deposition, physical vapor deposition and other suitable method. The thickness of the refractive index matching film 1026 is in the range of 10 nm-900 nm. For example, the thickness of the refractive index matching film 1026 can be in a range of 50 nm-100 nm. The refractive index matching film 1026 has a first refractive index n1. In the embodiments of the present disclosure, the refractive index matching film 1026 can be fabricated by one or more materials selected from indium tin oxide (n1=2.0), silicon nitride (n1=2.3), silicon carbide (n1=2.6), titanium dioxide (n1=2.7), and other suitable material, but no specific limitations will be given in the embodiments of the present disclosure in this respect.

As illustrated in FIG. 5D, after the refractive index matching film 1026 is formed, an adhesive layer 1012, for example, can be attached to the side, which is away from the base film 1011, of the refractive index matching film 1026.

The adhesive layer 1012 has a second refractive index n2, and the first refractive index n1 of the refractive index matching film 1026 is larger than the second refractive index n2 of the adhesive layer 1012. The material of the adhesive layer 1012, for example, can be a pressure-sensitive adhesive (n2≈1.45-1.50) or an optical transparent adhesive (n2≈1.45-1.50) or any other suitable material, but no specific limitations will be given in the embodiments of the present disclosure in this respect.

As illustrated in FIG. 5D, a detection circuit 1013, for example, can be adhered to the side, which is away from the base film 1011, of the adhesive layer 1012, and the detection circuit 1013, for example, can include a photoelectric sensor, a fingerprint identification chip and the like. Because the entire area of the adhesive layer 1012 is in contact with the detection circuit 1013 and is adhesive, the fixation effect to the detection circuit 1013 call be improved. The detection circuit 1013 is used for obtaining the image information of the fingerprint, so as to realize the fingerprint identification. For example, in the case that light emitted by the organic light emitting element 1019 of the fingerprint identification device 200 is incident onto the fingerprint, light reflected by the fingerprint can be formed. In the case that the light reflected by the fingerprint of the fingerprint sequentially passes through the refractive index matching film 1026 and the adhesive layer 1012, and then is incident onto the detection circuit 1013, part of the light (i.e., part of or all of the stray light) reflected by the fingerprint can be filtered out because light total reflection occurs at the interface between the refractive index matching film 1026 and the adhesive layer 1012, and therefore, the quality of the fingerprint images obtained by the detection circuit 1013 is increased.

As illustrated in FIG. 5D, an adhesive tape 1014 can be attached to both lateral sides of the detection circuit 1013 in the direction parallel to the base film 1011 and is attached to the side, which is away from the base film 1011, of the adhesive layer 1012 through controlling of the accuracy in attaching the adhesive tape 1014, such that the adhesive tape 1014, for example, can further improves the fixation effect to the detection circuit 1013. In the embodiments of the present disclosure, the adhesive tape 1014, for example, can be an adhesive tape with light-shielding function, and therefore, in addition to fixing of the detection circuit 1013, the adhesive tape 1014 also can prevent photo-induced carriers from generating in thin film transistors of the display array layer 1020 when external light is incident onto the thin film transistors, such that undesired leakage current can be avoided. Furthermore, the adhesive tape 1014, for example, can be a soft adhesive tape, and therefore, the adhesive tape 1014, for example, can further have cushion effect to the fingerprint identification device 100 in the case that the fingerprint identification device 100 falls down from a high place and the side, with the adhesive tape 1014 being provided, of the fingerprint identification device 100 is in contact with the ground, and destructions, which is caused by drop and impact, to the fingerprint identification device 100 can be alleviated.

In the fingerprint identification device 200 provided by at least one embodiment of the present disclosure, the contact area with the detection circuit 1013 of the adhesive layer 1012 is increased by providing the adhesive layer 1012 to adhere the detection circuit 1013 onto the base film 1011. The adhesive layer 1012 is not easily subjected to fractures, for example, in the case that the base film 1011, which is flexible, is bent, and therefore, fixation effect to the detection circuit 1013 is improved.

In another aspect, in the fingerprint identification device 200 provided by at least one embodiment of the present disclosure, the refractive index matching film 1026 is provided between the base film 1011 and the adhesive layer 1012. In the case that the light reflected by the fingerprint of the fingerprint sequentially passes through the refractive index matching film 1026 and the adhesive layer 1012, and then is incident onto the detection circuit 1013, because the first refractive index n1 of the refractive index matching film 1026 is larger than the second refractive index n2 of the adhesive layer 1012, part of the light (i.e., at least part of the stray light) reflected by the fingerprint can be filtered out because light total reflection occurs at the interface between the refractive index matching film 1026 and the adhesive layer 1012, and therefore, the quality of the fingerprint images obtained by the detection circuit 1013 is increased, and the fingerprint identification accuracy of the fingerprint identification device 200 is increased.

It should be noted that the execution sequence of the above-mentioned steps can be changed when required. For example, the base film 1011, the refractive index matching film 1026, the detection circuit 1013 and the like can be formed after the display array layer and the touch control layer are formed, and no specific limitations will be given in the embodiments of the present disclosure in this respect.

The technical effect of the fingerprint identification device 200 can refer to the technical effect of the fingerprint identification device described in the above-mentioned embodiments and no further descriptions will be given here.

In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

What is claimed is:

1. A fingerprint identification device, comprising:
a base film;
a detection circuit, which is provided at a first side of the base film;
an adhesive layer, which is provided on the first side of the base film and is provided between the base film and the detection circuit, so as to adhere the detection circuit onto the base film; and
a refractive index matching film, which is provided on the first side of the base film and provided between the base film and the adhesive layer,
wherein the refractive index matching film has a first refractive index, the adhesive layer has a second refractive index, and the first refractive index is larger than the second refractive index;
the refractive index matching film is in direct contact with the adhesive layer;
the fingerprint identification device further comprises a display array layer,
the display array layer and the detection circuit are superposed;
the display array layer is provided at a side, which is closer to the adhesive layer, of the detection circuit;
the display array layer is provided at a second side of the base film,
wherein the second side of the base film is opposite to the first side of the base film,
the display array layer comprises a plurality of sub-pixels, which are arrayed, and the display array layer further comprises at least one opening provided between adjacent sub-pixels, and an orthographic projection of the opening on the detection circuit and the detection circuit at least partially overlap with each other.

2. The fingerprint identification device according to claim 1, wherein a material of the refractive index matching film comprises at least one of an indium tin oxide, a silicon nitride, a silicon carbide or a titanium dioxide.

3. The fingerprint identification device according to claim 1, wherein the refractive index matching film is made of the silicon nitride.

4. The fingerprint identification device according to claim 1, wherein the base film, the refractive index matching film and the adhesive layer are provided to increase a ratio between an intensity of light incident onto the detection circuit and an intensity of light exited from the first side of the base film.

5. The fingerprint identification device according to claim 4, wherein the base film has a third refractive index, and
the third refractive index is smaller than the first refractive index and is larger than the second refractive index.

6. The fingerprint identification device according to claim 5, wherein a thickness of the refractive index matching film is larger than ¼ of a blue light wavelength and is smaller than a red light wavelength.

7. The fingerprint identification device according to claim 6, wherein the thickness of the refractive index matching film is in a range of 145 nm 650 nm.

8. The fingerprint identification device according to claim 1, wherein an orthographic projection of the detection circuit on the base film is completely within an orthographic projection of the adhesive layer on the base film.

9. The fingerprint identification device according to claim 1, wherein the adhesive layer comprises a pressure-sensitive adhesive or an optical transparent adhesive.

10. The fingerprint identification device according to claim 1, wherein the display array layer is an organic light emitting diode display array layer,
each of the sub-pixels comprises an organic light emitting element and the opening is provided between organic light emitting elements of the adjacent sub-pixels.

11. The fingerprint identification device according to claim 1, wherein the display array layer further comprises a light shield layer, and the light shield layer comprises at least one pinhole; and
an orthographic projection of the pinhole on the detection circuit and the orthographic projection of the opening on the detection circuit at least partially overlap with each other, so as to allow light passing through the pinhole to be able to pass through the opening, such that the light is able to incident on the detection circuit and to be used for fingerprint identification.

12. The fingerprint identification device according to claim 1, wherein the display array layer comprises a base substrate;
a side, which is closer to the base film, of the base substrate is attached to the base film; and
the plurality of sub-pixel is provided at a side, which is away from the base film, of the base substrate.

13. The fingerprint identification device according to claim 12, wherein the base film comprises a flexible membrane and the base substrate comprises a flexible substrate.

14. The fingerprint identification device according to claim 1, further comprising a touch control structure,
wherein the touch control structure is provided at a side, which is away from the base film, of the display array layer.

15. An electronic device, comprising the fingerprint identification device according to claim 1.

16. The fingerprint identification device according to claim 1, wherein the first refractive index is greater than 2.0 and smaller than 2.7.

17. A manufacturing method for a fingerprint identification device, comprising:
providing a base film;
forming an adhesive layer on a first side of the base film; and
providing a detection circuit at a side, which is away from the base film, of the adhesive layer, so as to allow the adhesive layer to adhere the detection circuit onto the first side of the base film,
wherein before forming the adhesive layer on the first side of the base film, the method further comprises:
forming a refractive index matching film on the first side of the base film, wherein the adhesive layer is formed on a side, which is away from the base film, of the refractive index matching film, so as to form the adhesive layer on the first side of the base film;
the refractive index matching film has a first refractive index, the adhesive layer has a second refractive index, and the first refractive index is larger than the second refractive index;
the refractive index matching film is in direct contact with the adhesive layer;
the fingerprint identification device further comprises a display array layer,
the display array layer and the detection circuit are superposed;
the display array layer is provided at a side, which is closer to the adhesive layer, of the detection circuit;
the display array layer is provided at a second side of the base film,
wherein the second side of the base film is opposite to the first side of the base film,
the display array layer comprises a plurality of sub-pixels, which are arrayed, and the display array layer further comprises at least one opening provided between adjacent sub-pixels, and
an orthographic projection of the opening on the detection circuit and the detection circuit at least partially overlap with each other.

18. The manufacturing method for the fingerprint identification device according to claim 17, wherein the first refractive index is greater than 2.0 and smaller than 2.7.

* * * * *